United States Patent [19]
Sekii et al.

[11] Patent Number: 5,994,723
[45] Date of Patent: Nov. 30, 1999

[54] SEMICONDUCTOR ELEMENT AND ITS METHOD OF MANUFACTURING

[75] Inventors: Hiroshi Sekii; Koichi Imanaka, both of Kyoto, Japan

[73] Assignee: Omron Corporation, Kyoto, Japan

[21] Appl. No.: 08/056,941

[22] Filed: May 5, 1993

Related U.S. Application Data

[63] Continuation of application No. 07/653,271, Feb. 11, 1991, abandoned.

[30] Foreign Application Priority Data

Feb. 15, 1990 [JP] Japan ........................................ 2-32575

[51] Int. Cl.⁶ .................................................. H01L 33/00
[52] U.S. Cl. .............................. 257/99; 257/94; 257/101; 372/45; 372/46; 372/50
[58] Field of Search ........................... 357/16, 17; 372/45

[56] References Cited

U.S. PATENT DOCUMENTS

| | | | |
|---|---|---|---|
| 3,984,262 | 10/1976 | Burnham et al. | 372/46 |
| 4,124,826 | 11/1978 | Dixon et al. | 372/46 |
| 4,359,775 | 11/1982 | Marschall et al. | 372/46 |
| 4,635,268 | 1/1987 | Motegi et al. | 357/17 |
| 4,792,958 | 12/1988 | Ohba et al. | 357/17 |
| 4,847,844 | 7/1989 | Noda et al. | 357/17 |
| 4,941,146 | 7/1990 | Kobayashi | 357/17 |
| 4,999,310 | 3/1991 | Kim | 357/17 |

*Primary Examiner*—Jerome Jackson, Jr.
*Assistant Examiner*—Bradley William Baumeister
*Attorney, Agent, or Firm*—Dickstein Shapiro Morin & Oshinsky LLP

[57] ABSTRACT

An improved semiconductor construction and method of fabrication having a luminous element for emitting light is provided composed of a layer having a pn junction formed with a first semiconductor layer of a first conductivity type and a second semiconductor layer of a second conductivity type on an upper portion of a luminescent layer. In one portion of the above-described layer, an area for a current path consisting of the second conductivity type is formed extending from the second semiconductor layer to the first semiconductor layer. An ohmic contact electrode is then created covering substantially the entire upper surface of the second semiconductor layer with the exception of the area defined for the current path.

10 Claims, 7 Drawing Sheets

SEMICONDUCTOR ELEMENT AND ITS METHOD OF MANUFACTURING

This application is a continuation of application Ser. No. 07/653,271 filed Feb. 11, 1991, now abandoned.

BACKGROUND OF THE INVENTION

1. Technical Field

This invention relates to a semiconductor element having an ohmic contact construction and a method of producing that element.

2. Background of the Prior Art

As an example of a semiconductor element, the following discussion will focus on a luminous element emitting light from its upper surface, having a very short path of emission, and composed of materials of the AlGaAs family.

In the AlGaAs family, the ohmic contact resistance can be easily reduced by using GaAs without the Al, and an n-type material. Accordingly, an n-type GaAs material is widely used as the cap layer to achieve electrode and ohmic contact.

Figure 7A:
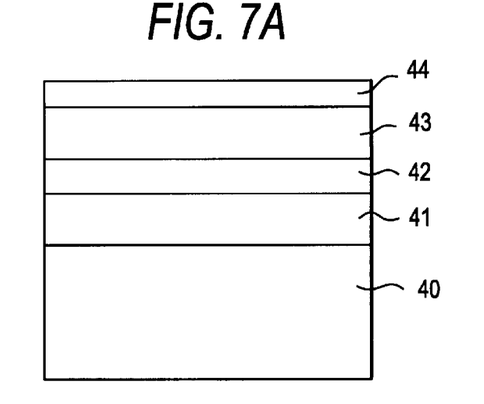
FIGS. 7A through 7D are cross-sectional views and FIG. 7E is an overhead view showing the process used to produce an existing type of luminous element for emitting light from its upper surface and the structure of such an element.
Figure 7B:
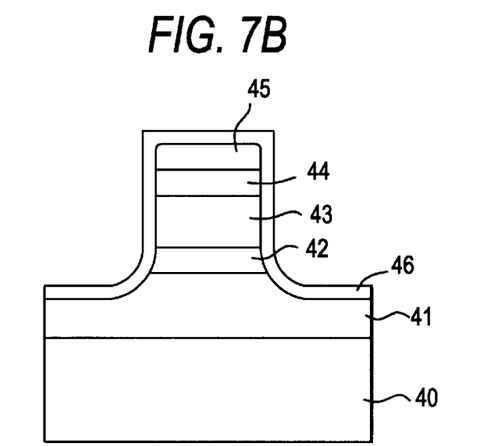
Figure 7C:
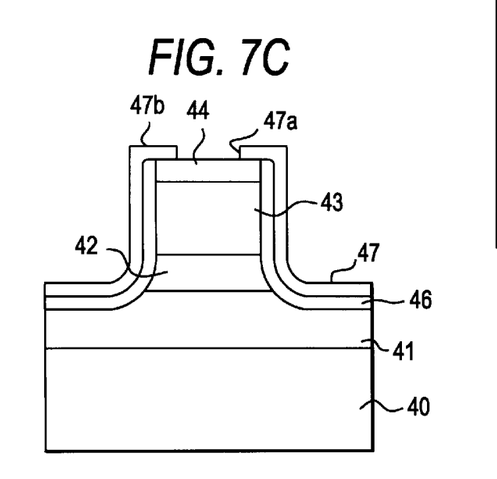
Figure 7D:
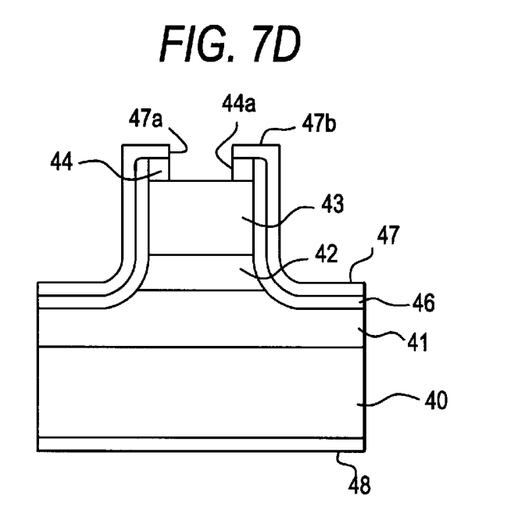
Figure 7E:
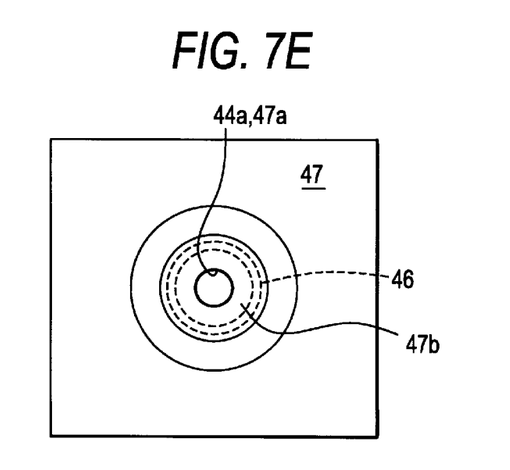

FIGS. 7A through 7E show a process used to produce a luminous element emitting light from its upper surface. More particularly, FIGS. 7D and 7E show, respectively, a cross section of the completed luminous element and an overhead view of its upper surface.

As shown in FIG. 7A, a p-type AlGaAs lower cladding layer 41, a GaAs active layer 42, an n-type AlGaAs upper cladding layer 43 and an n-type GaAs cap layer 44 are successively grown on a p-type GaAs substrate 40. A circular pattern is then created in FIG. 7B in the center portion of the upper surface of cap layer 44 for the luminescent area. The pattern is formed by photolithography using an AZ-resist 45 as a mask. The unmasked area is then removed by etching down to the depth of the lower cladding layer 41. After etching, the entire surface is covered with an insulating film consisting primarily of $SiO_2$ 46.

As shown in FIG. 7C, the AZ resist 45 and the insulating film above it are then removed. Next another circular pattern, smaller than the aforementioned AZ resist 45, is formed on cap layer 44, again using AZ resist as a mask (not pictured). This AZ resist allows an electrode 47 for the n-side to be fused by vapor deposition to the periphery of cap layer 44 and the entire surface of insulating film 46. The aforementioned AZ resist is then removed. By this process, light emission window 47a is formed, and the n-side electrode 47 is brought into ohmic contact with cap layer 44 in an annulus 47b around window 47a.

Because the n-type GaAs cap layer 44 functions as an absorption layer for the emitted light, the central portion of cap layer 44 is removed as seen in FIG. 7D by etching, leaving only the peripheral portion lying beneath the ohmic contact annulus 47b. Thus, as shown in top view in FIG. 7E and by cross-section in FIG. 7D, the light emission window 44a is extended through cap layer 44.

In order to shorten the path of emission in this type of element, which emits light from its upper surface, the area surrounding the portion emitting light is etched away with the result that the current flow is confined to a constricted region. Correspondingly, the ohmic contact with the electrode is restricted to the portion 47b of the uppermost layer.

For the crystal in the uppermost layer, a material must thereby be chosen which can minimize the contact resistance, and the surface of the element must be covered with this material. However, since this material will absorb light, it will reduce the output of the light emitting element. Thus, it is necessary to use a process (i.e., the creation of window 44a) which will remove, by etching or some similar procedure, the portion of the surface which overlies the area of emission.

If the path of emission is made shorter, the area of the ohmic resistance portion will also be reduced. As a result, the driving voltage will increase, and because of increased heat dissipation, an anticipated improvement in light output will not occur.

In order to judge the quality of ohmic contact, the contact resistance ($\Omega \cdot cm^2$) is evaluated as to whether it is larger or smaller than $10^{-5}$; the smaller the contact resistance, the better the contact. With the aforementioned luminous element which emits light from its upper surface, $Rc = 5 \times 10^{-6}$ ($\Omega \cdot cm^2$), the inner diameter of ohmic contact portion 47b is 80 μm. and its outer diameter is 100 μm. Thus, the area of contact is approximately $3 \times 10^{-5}$ $cm^2$, and the contact resistance is approximately 0.17 $\Omega$.

If the area of light emission is made even smaller, the ohmic contact area will be further reduced, resulting in an additional further increase in contact resistance. Any increase in the resistance component is expressed as a greater production of heat, which lowers the output of the luminous element.

Several examples of luminous elements exist which emit light from their edges. These elements use a diffusion process to form the constricted region in which current can flow.

Figure 8:
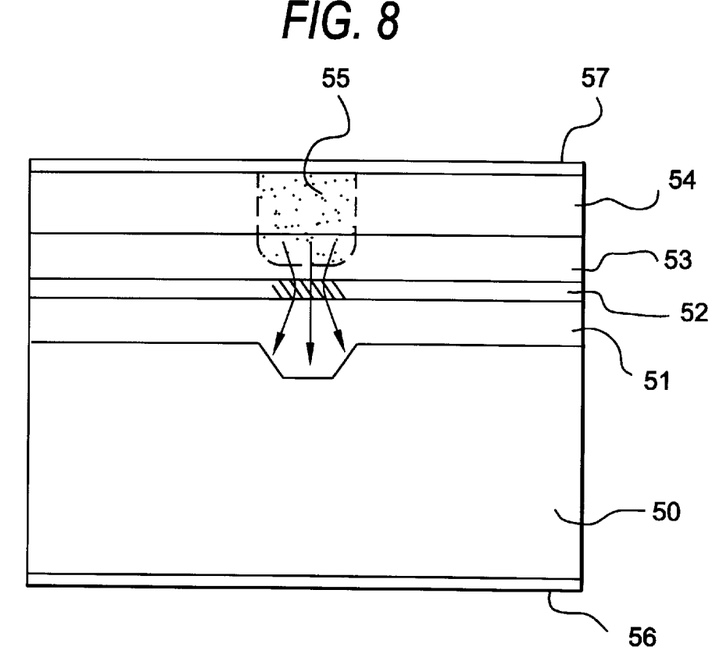
FIG. 8 is a cross sectional view showing the structure of a CSP laser.

FIG. 8 shows an example of a Channeled Substrate Planar laser ("CSP laser") design. A CSP laser is constructed by first forming a groove on an n-type GaAs substrate 50 by photolithography or another similar process. To this substrate are then added, successively: an n-type $AlxGa_{1-x}As$ lower cladding layer 51; a p-type $AlyGa_{1-y}As$ active layer 52; a p-type $Al_{x+}Ga_{1-x}As$ upper cladding layer 53; and an n-type GaAs cap layer 54. The p+-type Zn diffusion area 55 is formed in cap layer 54 and upper cladding layer 53; the p-side electrode 57 is formed on the growth surface, and an n-side electrode 56 is formed on the substrate's undersurface.

In this way, a portion of the uppermost n-type layer, such as cap layer 54, and a portion of the p-type layer are interchanged through the use of a Zn diffusion process, thus forming a restricted region in which current can flow. Further, the entire surface of cap layer 54 is covered by a p-type electrode 57, which makes ohmic contact with the narrow area 55 where the p-layer and n-layer are interchanged.

As stated previously, the quality of ohmic contact is judged by the Rc. For example, if $Rc = 5 \times 10^{-6}$ ($\Omega \cdot cm^2$), the area of region 55 where the p-layer replaces the n-layer will be $1.5 \times 10^{-5}$ $cm^2$, and the contact resistance will be approximately 0.33 $\Omega$. If the area where the p-layer replaces the n-layer is made even smaller, in order to reduce the luminous area, the resistive component resulting from the contact resistance will increase.

Figure 9:
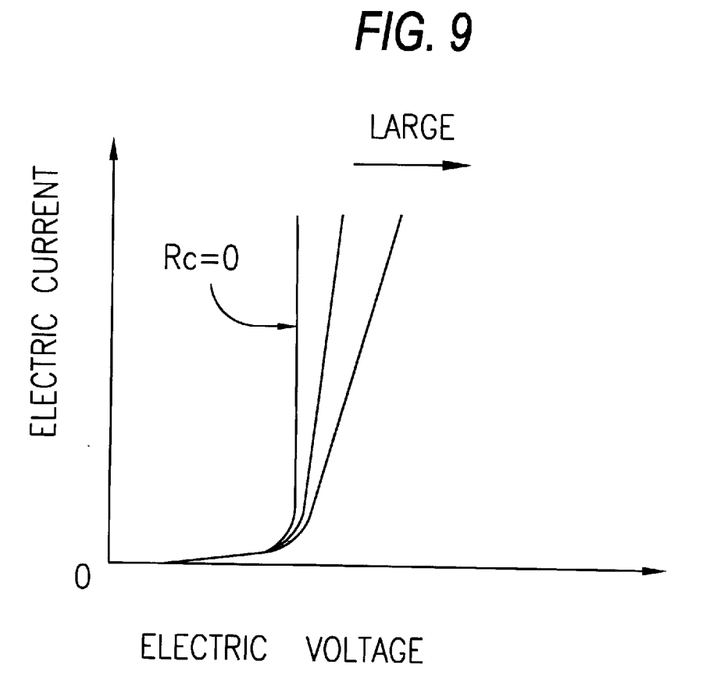
FIG. 9 is a graph showing how forward voltage and current characteristics vary with contact resistance in a semiconductor luminous element.

FIG. 9 is a graph illustrating how the forward voltage and current characteristics depend on the Rc in a luminous element. As the contact resistance increases, it causes the driving voltage to increase. The increase in contact resistance becomes evident as an increase in the calorific value which causes a decrease in the output of the luminous element.

When a diffusion process is used, the conductivity types are interchanged on a portion of the uppermost layer. This construction yields a luminous element with a constricted current path which emits light from its edges. Some other examples of this type of luminous element are Terraced Substrate lasers ("TS lasers") and Transverse Junction Stripe lasers ("TJS lasers"). However, these elements, too, are constructed by directly covering an area of reversed polarity with an ohmic electrode. This gives rise to problems in minimizing the contact resistance. If the area of reversed polarity is reduced, the increase in contact resistance will cause the driving voltage to increase, and the increased generation of heat will prevent any improvement of luminous output.

SUMMARY OF THE INVENTION

In view of the foregoing, it should be apparent that there still exists a need in the art for a method of and a construction for a semiconductor element that minimizes the ohmic contact resistance between the uppermost layer and the electrode of the semiconductor.

More particularly, it is an object of the invention to increase the luminous output of the semiconductor element without increasing the dimensions of the luminous area.

Yet an additional object of the invention is to allow virtually the entire surface of the semiconductor layer to make ohmic contact with an electrode. As a result, the contact resistance is minimized.

It is a further object of this invention to provide the construction in a luminous element of the type which emits light from its upper surface or of the type which emits light from its edges, enabling the area of emission to be made smaller. Because the contact resistance is small, it is possible to curb the increment in drive voltage so that the heat generation which would accompany such an increment does not reduce the luminous output.

A further, object of this invention is to use a luminous element of the type which emits light from its upper surface such that there is no need to cover the uppermost layer with a crystalline material.

Yet another object of the invention is to obviate the need for a partial etching process to create an opening for light emission. Thus the effect of this invention is a simplification of the semiconductor fabrication process.

Briefly described, these and other objects of the invention are achieved in its apparatus aspects by a semiconductor element composed of a layer to impede the current, consisting of a pn junction formed with a first semiconductor layer, of a first conductivity type, and a second semiconductor layer, of a second conductivity type; in one portion of the above, an area for a current path of the second conductivity type exists, going from the second semiconductor layer to the first semiconductor layer; and an ohmic contact electrode exists covering virtually the entire upper surface of the second semiconductor layer.

The apparatus objects of the invention are further met by a semiconductor element that is a luminous element for emitting light from its upper surface. The element is composed of a layer to impede the current, consisting of a pn junction formed with a first semiconductor layer, of a first conductivity type, and a second semiconductor layer, of a second conductivity type, on the upper portion of a luminescent layer; in one portion of the above, an area for a current path of the second conductivity type is formed, going from the second semiconductor layer to the first semiconductor layer; and an ohmic contact electrode is employed covering the entire upper surface of the second semiconductor layer, with the exception of the upper portion of the area for the current path.

The semiconductor element object of this invention is also met by a luminous element for emitting light from its edges, composed of a layer to impede the current, consisting of a pn junction formed with a first semiconductor layer, of a first conductivity type, and a second semiconductor layer, of a second conductivity type, on the upper portion of the luminescent layer; in one portion of the above, facing the edge of the semiconductor element, an area for a current path of the second conductivity type, going from the second semiconductor layer to the first semiconductor layer is formed; an ohmic contact electrode is created covering the entire surface of the second semiconductor layer.

The method of the present invention is carried out by producing a semiconductor element by forming a layer to impede the current, consisting of a pn junction composed of a first semiconductor layer, of a first conductivity type, and a second semiconductor layer, of a second conductivity type; then forming in one portion of the above, an area for a current path of the second conductivity type, going from the second semiconductor layer to the first semiconductor layer; and then creating an ohmic contact electrode which covers virtually the entire upper surface of the semiconductor layer.

With these and other objects, advantages and features of the invention that may become hereinafter apparent, the nature of the invention may be more clearly understood by reference to the following detailed description of the invention, the appended claims and to the several drawings attached herein. dr

DETAILED DESCRIPTION OF THE INVENTION

Figure 1A:
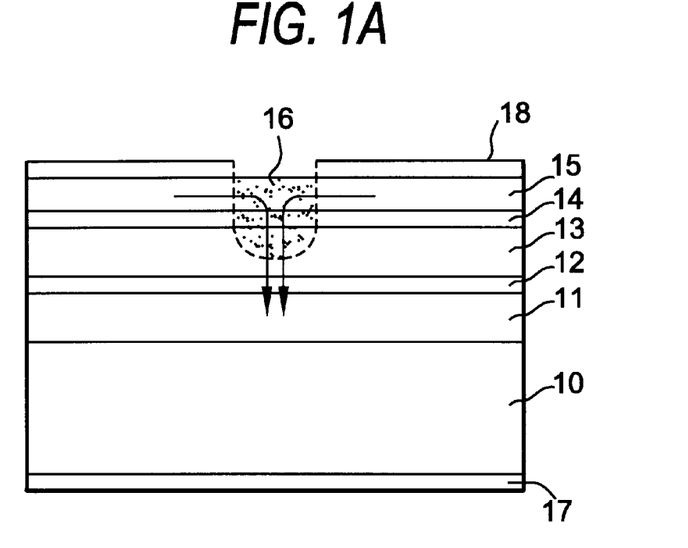
FIG. 1A shows a cross-sectional view of a luminous element for emitting light from its upper surface representing a first embodiment of the present invention.
Figure 1B:
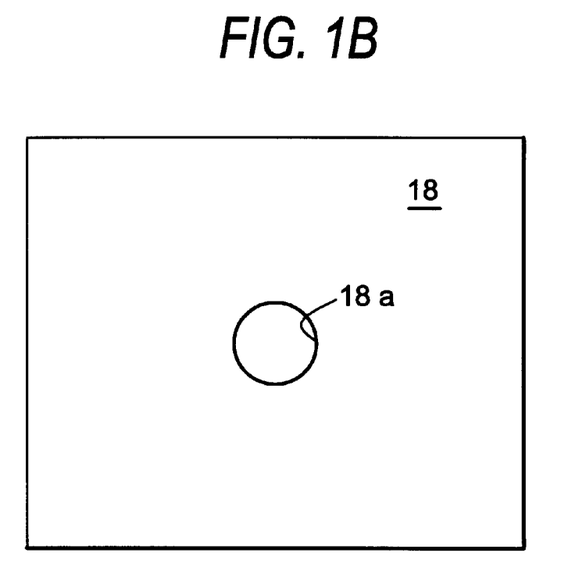
FIG. 1B is an overhead view of the embodiment shown in FIG. 1A.
Figure 2A:
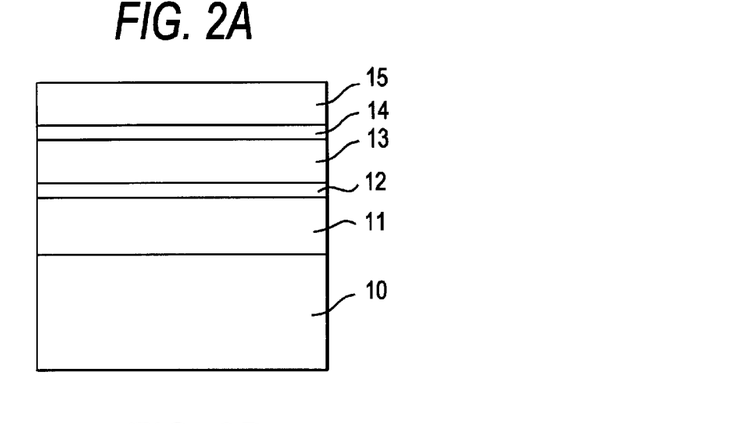
FIGS. 2A through 2C are cross-sectional views of the process used to produce a luminous element emitting light of the first embodiment from its upper surface shown in FIG. 1A.
Figure 2B:
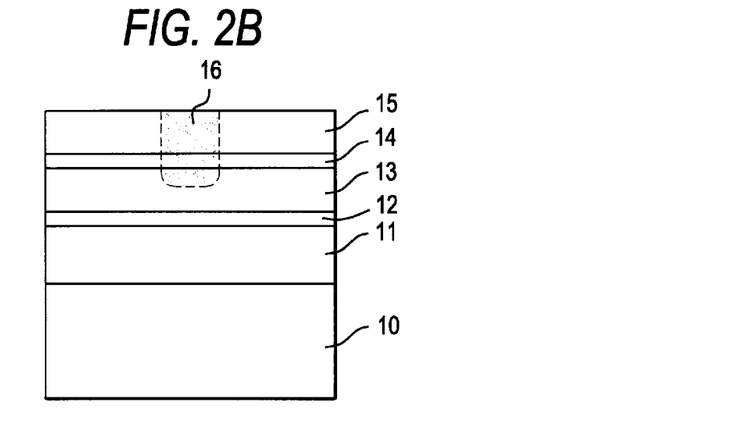
Figure 2C:
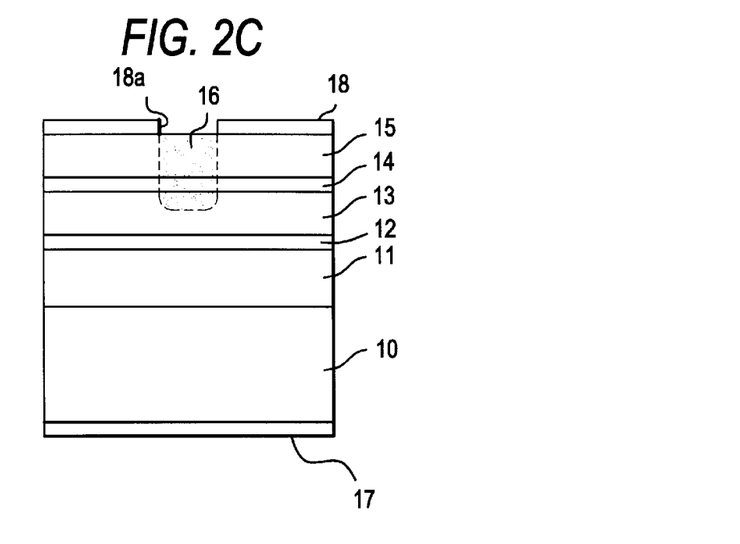

Referring to FIG. 1A wherein like elements are referred to by like reference numerals, a cross-sectional view of the luminous element for emitting light from its upper surface representing a first embodiment of the invention is shown while FIG. 1B is a top view of this element and FIGS. 2A through 2C show the process used to produce the top-emitting luminous element of FIG. 1A.

The first embodiment of FIGS. 1A and 1B is best understood by referring to the fabrication process shown in FIGS. 2A–2C. The elements referred to in those Figures also are shown in FIGS. 1A and 1B.

In FIG. 2A, an n-type AlGaAs lower cladding layer 11, a GaAs active layer 12, a p-type AlGaAs upper cladding layer 13, an n-type AlGaAs layer 14 and a p-type AlGaAs cap layer 15 are successively grown on an n-type GaAs substrate 10. This produces a pnpn-type structure.

Next, as shown in FIG. 2B, zinc is diffused in the desired location (for example, in the center) on the p-type AlGaAs cap layer 15 creating p-type Zn diffusion area 16. Specifically, the diffusion area 16 is formed by coating a diffusing agent onto the cap layer ("OCD") or by using a process to diffuse zinc from the inside of a quartz tube. The zinc is diffused in the desired path of emission as far as the p-type AlGaAs upper cladding layer 13. The result of this is that a portion of the n-type AlGaAs layer 14 is turned into a p-type layer. Because the current is restricted to a p-type Zn diffusion area 16, the design results in a region within which current flow will be constricted.

Referring to FIG. 2C, a mask is then formed by applying AZ resist only to the p-type Zn diffusion area 16 using photolithography or some similar process. The p-side electrode 18 is then bonded to the entire surface of cap layer 15 by vapor deposition. The mask is then lifted off to create window 18a in p-side electrode 18 to allow light to exit. Finally, an n-side electrode 17 is formed on the underside of substrate 10.

Thus, except for window 18a, the entire surface of p-side electrode 18 makes ohmic contact with cap layer 15.

In the previously described prior art, the smaller the area to which current flow was confined, the larger the contact resistance. As a result, a high output was problematical. In the aforementioned embodiment, however, ohmic contact was achieved in the entire area with the exception of the area through which light is to be transmitted. Consequently, the smaller the light emission window, the smaller the contact resistance. This allows a high output to be achieved. Because there is a large area of ohmic contact, a p-type AlGaAs layer, which was not used in this case due to its large contact resistance, could nonetheless be used as a cap layer as shown in FIGS. 1A, 1B and 2C. Such a cap layer would not function as a light absorption layer, so there would be no need to etch it. This would simplify the production process.

This invention is not limited to materials of the AlGaAs family, nor is it limited to a p-type Zn diffusion area. It might also be employed as a diffusion area of reverse polarity, and the area could be created by ion implantation.

Figure 3:
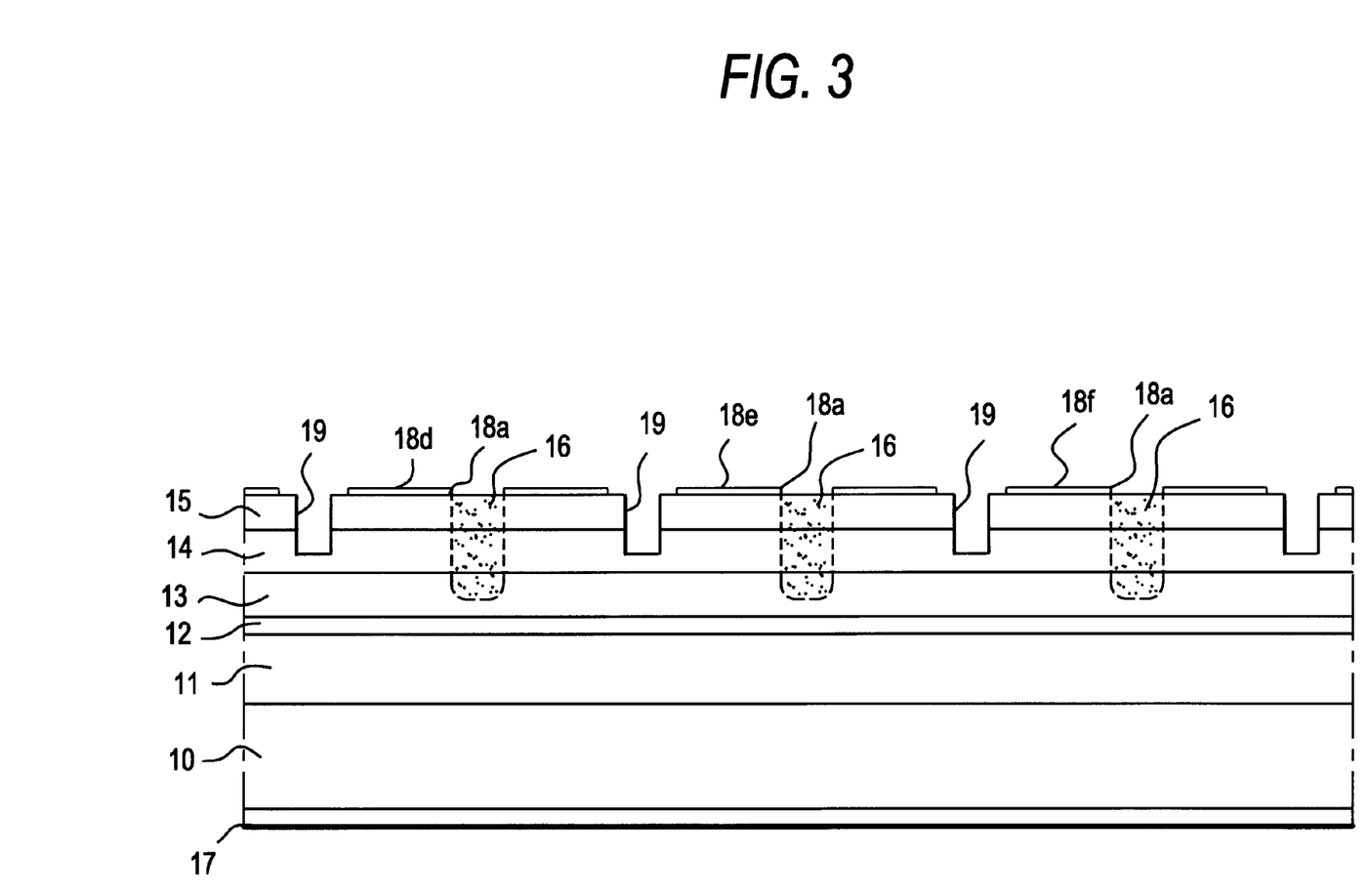
FIG. 3 is a cross-sectional view of an array of top-emitting luminous elements representing the first embodiment.

With this invention, one can also create an array of luminous elements. Specifically, FIG. 3 shows a two-dimensional array of luminous elements shown in FIG. 1A.

An n-type AlGaAs lower cladding layer 11, a GaAs active layer 12, a p-type AlGaAs upper cladding layer 13, an n-type AlGaAs layer 14 and a p-type AlGaAs cap layer 15 are formed on an n-type GaAs substrate 10. On the upper surface of this wafer, multiple channels 19, orthogonal to each other, are formed at specified intervals, both lengthwise and crosswise. The channels extend downward as far as the n-type AlGaAs layer 14. The regions surrounded by these channels become individual luminous elements.

In a portion of each of the luminous elements, a p-type Zn diffusion area 16 is formed. The p-side electrodes 18d, 18e, 18f, and so on, are formed which transform the upper portion of each area 16 into a light emission window 18a. Electrodes 18d through 18f are isolated from each other. A common n-side electrode 17 is created on the underside of the wafer.

Figure 4:
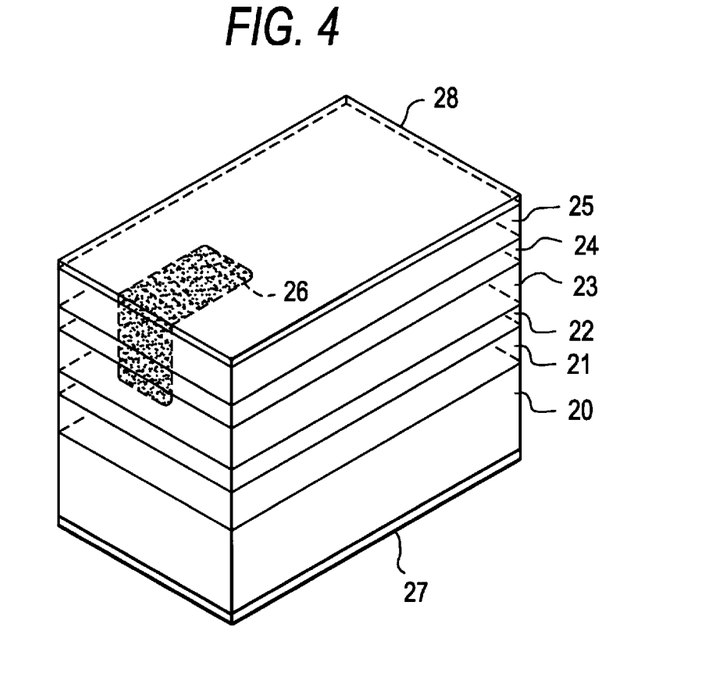
FIG. 4 is an oblique view showing the structure of a light emitting diode which emits light from its edges representing a second embodiment of the present invention.

FIG. 4 is an oblique view of a second embodiment of this invention in which the luminous element emits light from its edges. In this embodiment, the p-type Zn diffusion area 26 is shaped in a semi-elliptical pattern in order to maximize the efficacy of a design using a very short path of emission. This type of luminous element, with a p-type Zn diffusion area, is formed into a pattern is known as a superluminescent diode.

Figure 5A:
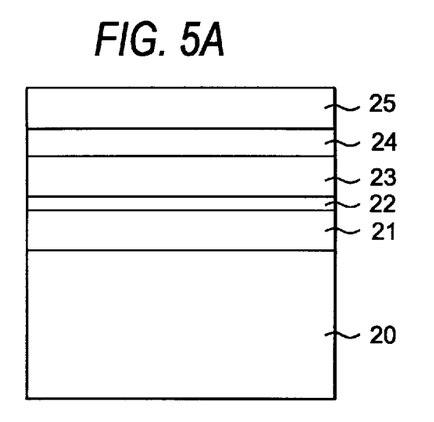
FIGS. 5A through 5C are cross-sectional views of the process used to produce a light emitting diode of the second embodiment which emits light from its edges as shown in FIG. 4.
Figure 5B:
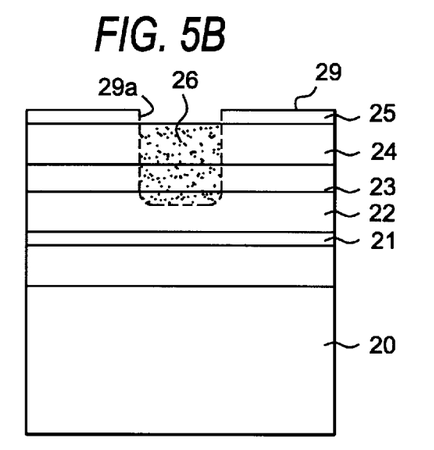
Figure 5C:
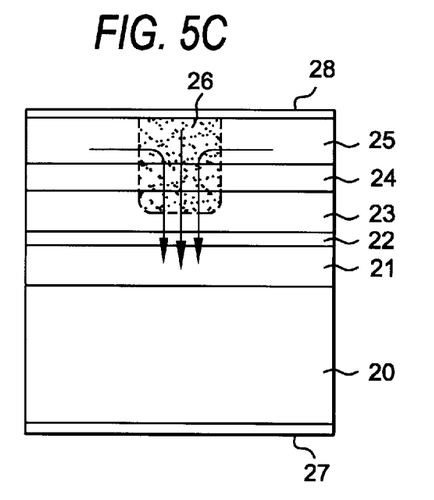

To better understand the structure of the luminous element shown in FIG. 4, the process for producing it is shown in FIGS. 5A–5C. Specifically, in FIG. 5A an n-type AlGaAs lower cladding layer ($10^{18}$ cm$^{-3}$, 1 $\mu$m) 21, a GaAs active layer (non-doped, 0.1 $\mu$m) 22, a p-type AlGaAs upper cladding layer ($10^{18}$ cm$^{-3}$) 23, an n-type GaAs ($10^{17}$ cm$^{-3}$, 0.5 $\mu$m) 24, and a p-type GaAs cap layer (approx. $10^{19}$ cm$^{-3}$, 1 $\mu$m) 25 are successively grown on an n-type GaAs substrate 20.

Next, a mask 29, as shown in FIG. 5B, is formed by applying SiO$_2$ or a similar substance to the entire upper surface of cap layer 25. A window 29a of the desired size is created by photolithography or a similar process in a given location on the edge of the wafer. This window, which is formed by photolithography or a similar process, looks out on the edge of the wafer. Through this window 29a, zinc is diffused as far as p-type AlGaAs upper cladding layer 23. This is done by using a spreadable diffusing agent (OCD) or by using a process to diffuse zinc from the inside of a quartz tube. This process creates a p-type Zn diffusion area 26.

The surface which is a boundary between the n-type GaAs layer 24 and the p-type GaAs cap layer 25 becomes a current barrier. However, the n-type GaAs layer 24 has been transposed with the next p-type layer in p-type Zn diffusion area 26. Thus the design permits the flow of current only in the Zn diffusion area.

Finally, in FIG. 5C, mask 29 is removed, and a p-side electrode 28 and an n-side electrode 27 are created on the wafer's upper and lower surfaces, respectively.

By this process, the entire surface of the p-type GaAs cap layer 25 is brought into ohmic contact with the p-side electrode 28. The contact resistance is kept infinitessimally small, and a high output is achieved.

Figure 6:
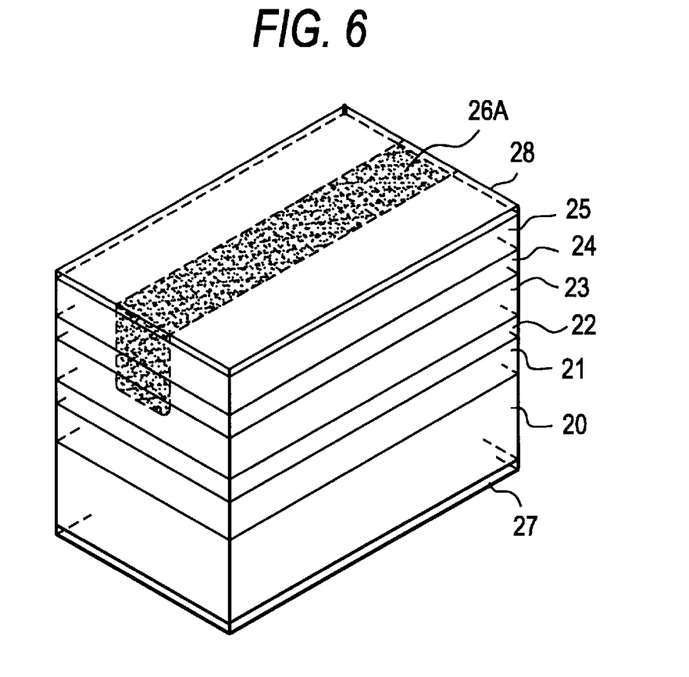
FIG. 6 is an oblique view showing the structure of a semiconductor laser representing a third embodiment of the invention which emits light from its edges.

FIG. 6 shows a third embodiment in which a p-type Zn diffusion area 26, of a given width, extends along the entire length of the surface between the two edges. A wafer with this structure will sustain laser oscillation, so it is a semiconductor laser.

It is possible, then, to select the p-type Zn diffusion pattern of one's choice. The polarity of this diffusion area can also be reversed, or the area can be created by ion implantation. The materials used for the semiconductor are not limited to those of the GaAs family.

Examples of this edge-emitter semiconductor laser can also be arranged in either one-dimensional or two-dimensional arrays, just as in the array shown in FIG. 3.

Although only preferred embodiments are specifically illustrated and described herein, it will be appreciated that many modifications and variations of the present invention are possible in light of the above teachings and within the purview of the appended claims without departing from the spirit and intended scope of the invention.

We claim:

1. A semiconductor element comprising:

a substrate of a first conductivity type;

a lower cladding layer of said first conductivity type on said substrate;

an active layer on said lower cladding layer;

an upper cladding layer of a second conductivity type on said active layer;

a blocking layer of said first conductivity type on said upper cladding layer;

a cap layer of said second conductivity type on said blocking layer;

an area for a current path of said second conductivity type formed in a portion of said cap layer and extending from said cap layer to said upper cladding layer, wherein said area for a current path is an area containing impurities at a concentration different from said cap layer; and an ohmic contact electrode covering substantially an entire upper surface of said cap layer.

2. A semiconductor luminous element for emitting light from its upper surface, comprising:

a substrate of a first conductivity type;

a lower cladding layer of said first conductivity type on said substrate;

an active layer on said lower cladding layer;

an upper cladding layer of a second conductivity type on said active layer;

a blocking layer of said first conductivity type on said upper cladding layer;

a cap layer of said second conductivity type on said blocking layer;

an area for a current path of said second conductivity type formed in a portion of said cap layer and extending from said cap layer to said upper cladding layer, wherein said area for a current path is an area containing impurities at a concentration different from said cap layer; and an ohmic contact electrode covering substantially an entire upper surface of said cap layer, said ohmic contact electrode having a window over said area for said current path to allow light to exit.

3. A semiconductor element as in claim 1, wherein said area containing impurities has a dopant diffused therein.

4. A semiconductor element as in claim 1, wherein said area containing impurities has ions implanted therein.

5. A semiconductor luminous element as in claim 2, wherein said area for said current path is in contact with an edge of said cap layer for emitting light from said edge.

6. A semiconductor luminous element as in claim 5, wherein said area for said current path extends entirely along a length of said cap layer between two of said edges.

7. A semiconductor luminous element as in claim 2, wherein said area containing impurities has a dopant provided therein.

8. A semiconductor luminous element as in claim 2, wherein said area containing impurities has ions implanted therein.

9. A semiconductor element as in claim 1, wherein said ohmic contact electrode minimizes contact resistance with said cap layer.

10. A semiconductor element as in claim 2, wherein said ohmic contact electrode minimizes contact resistance with said cap layer.

* * * * *